United States Patent [19]

Haulin

[11] Patent Number: 4,851,846

[45] Date of Patent: Jul. 25, 1989

[54] APPARATUS FOR CONVERTING AN ANALOG BALANCED SIGNAL TO A DIGITAL SIGNAL

[75] Inventor: Tord L. Haulin, Uppsala, Sweden

[73] Assignee: Telefonaktiebolaget L M Ericsson, Stockholm, Sweden

[21] Appl. No.: 128,340

[22] PCT Filed: Mar. 5, 1987

[86] PCT No.: PCT/SE87/00110

§ 371 Date: Dec. 2, 1987

§ 102(e) Date: Dec. 2, 1987

[87] PCT Pub. No.: WO87/06078

PCT Pub. Date: Oct. 8, 1987

[30] Foreign Application Priority Data

Apr. 2, 1986 [SE] Sweden ............................. 8505686

[51] Int. Cl.[4] ............................................. H03M 1/34
[52] U.S. Cl. ....................................................... 341/172
[58] Field of Search ............... 340/347 AD, 347 DA, 340/347 C

[56] References Cited

U.S. PATENT DOCUMENTS

| | | | |
|---|---|---|---|
| 3,056,085 | 9/1962 | James | 340/347 AD |
| 3,140,481 | 7/1964 | Hoffman | 340/347 C |
| 4,195,282 | 3/1980 | Cameron . | |
| 4,380,756 | 4/1983 | Worsman . | |
| 4,661,802 | 4/1987 | Yukawa | 340/347 DA |

FOREIGN PATENT DOCUMENTS 0064147 11/1982 European Pat. Off. .

OTHER PUBLICATIONS

J. L. McCreary et al, "All-MOS Charge Redistribution Analog-to-Digital Conversion Techniques-Part 1", *IEEE Journal of Solid-State Circuits*, vol. SC-10, No., 6 (Dec. 1975), pp. 371-385.

*Primary Examiner*—Bernard Roskoski
*Attorney, Agent, or Firm*—Burns, Doane, Swecker & Mathis

[57] ABSTRACT

An apparatus for converting an analog, balanced signal ($V_{IN+}$, $V_{IN-}$) to a digital signal by charge redistribution in a plurality of capacitors (1-5, 1'-5'). These are grouped in two sets and at least during an approximating phase can be selectively connected to two different reference voltages ($V_R$, earth) with the aid of switches (6-10, 6'-10'). The sets of capacitors are each arranged to act on the potential at their respective points (13,13') during an approximating phase and a comparator (15) is adapted for comparing the potentials at these points. The switches are controlled by a means (18) for sampling and approximating logic which generates digital control words in response to the comparison result, of the comparator.

5 Claims, 4 Drawing Sheets

APPARATUS FOR CONVERTING AN ANALOG BALANCED SIGNAL TO A DIGITAL SIGNAL

TECHNICAL FIELD

The invention relates to an apparatus for converting an analogue, balanced signal to a digital signal by charge redistribution in a plurality of capacitive elements, which are each connected in series with a controllable switch with which a first terminal in each capacitive element, at least during an approximating phase, may be selectively connected to a first or a second reference voltage.

BACKGROUND ART

Balanced signals are usually utilized in telephony technology, these signals being distinguished by the voltages in both conductors in a conductor pair being equally as great but of opposing polarity. In analogue-digital conversion of a balanced signal it is known first to convert it to an unbalanced signal and thereafter to convert the unbalanced signal to a digital signal. In the balance-unbalance conversion, half the dynamic range is lost however, since the signal voltage is limited by the feed voltage. The useful signals will also be distorted during the conversion, due to lack of linearity in the balance-unbalance converter.

It is therefore desirable to enable the analogue-digital-conversion of a balanced signal without first converting it to an unbalanced signal. One method for this is to utilize a separate A/D converter for each of the signal conductors of the balanced signal, and to connect the A/D converter outputs to a digital difference former. An apparatus for carrying out this method will be relatively voluminous and expensive, however.

SUMMARY OF INVENTION

The object of the present invention is to provide an apparatus for the analogue-digital conversion of balanced signals, which is more reliable, less voluminous and cheaper than previously available apparatus. This object is achieved in an apparatus of the kind given in the introduction by utilizing two sets of capacitive elements, these sets being connected to their respective input on a single comparator. The comparator output signal controls a means for sampling and approximating logic, which generates control signals to the switches connected in series with the capacitive elements.

In accordance with the present invention, there is provided apparatus for converting an analogue, balanced signal to a digital signal by charge redistribution in a plurality of capacitive elements, each of the plurality of capacitive elements being connected in series with respective ones of a plurality of controllable switches with which a first terminal in each capacitive element, at least during an approximating phase, may be selectively connected to a first or a second reference voltage, characterized in that the plurality of capacitive elements are grouped in two sets comprising equally as many capacitive elements selected such that each capacitive element in a first set corresponds to a capacitive element with just as great a capacity in the second set, in that the capacitive elements and associated switches in the first set are arranged to act on a potential at a first point and in that corresponding capacitive elements and switches in the second set are arranged to act on a potential at a second point, in that a comparator is arranged for comparison of the potentials at said first and second points and in that means for sampling and approximating logic are arranged to generate a digital word which is changed during the approximating phase in response to the comparison of the comparator, said digital word being utilized for controlling said plurality of switches and that at an end of the approximating phase said word constitutes a digital output signal of the apparatus.

The characterizing features of the invention are disclosed in the claims.

BRIEF DESCRIPTION OF DRAWINGS

The invention will now be described in detail with reference to the drawings, in which.

BEST MODE FOR CARRYING OUT THE INVENTION

Figure 1:
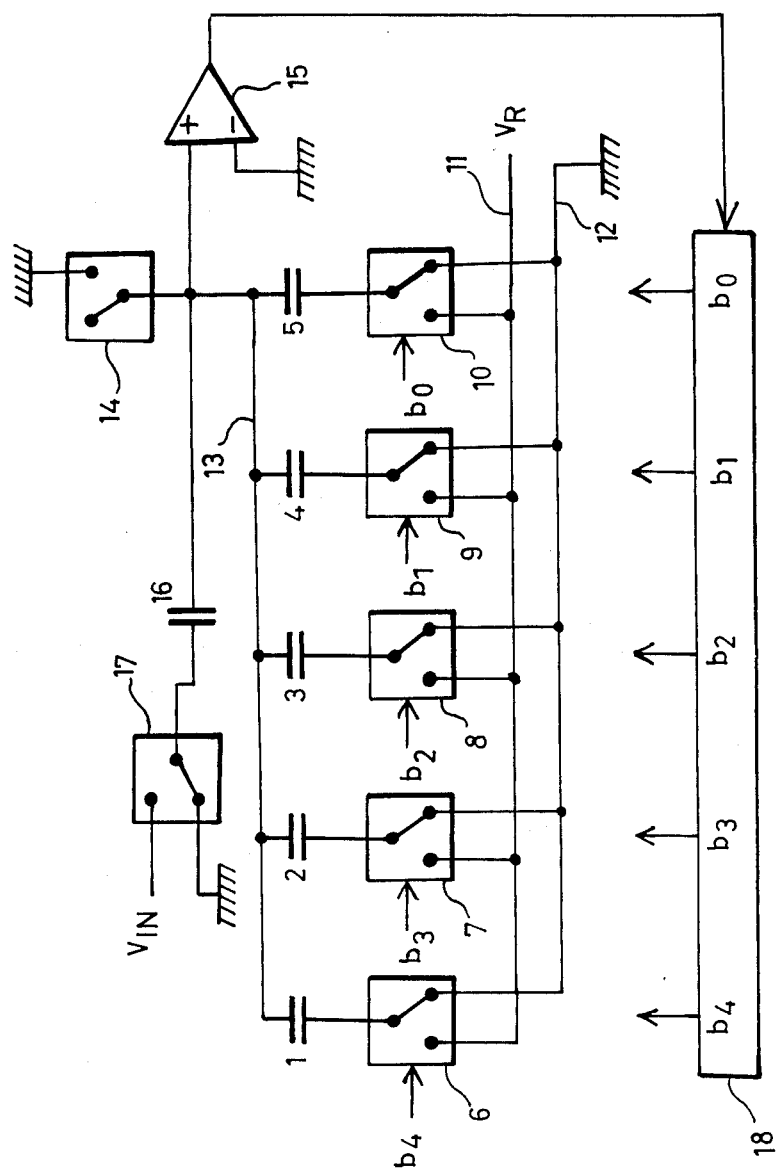
FIG. 1 illustrates an already known analogue-digital converter.

FIG. 1 illustrates an A/D converter which is arranged according to a known principle for conversion by charge redistribution in a plurality of capacitors. The converter accordingly includes a set of capacitors 1–5, of which capacitors 1–4 are a group with their capacitances mutually, binarily weighted. The capacitor 5 is usually called the terminating capacitor, and its capacitance is equal to the lowest capacitance of the capacitors 1–4. The capacitances of the capacitors 1–5, in that order, are thus assumed to be C, C/2, C/4, C/8 and C8. Controllable switches, one to each capacitor are denoted by the respective numerals 6–10. Each of the switches is adapted to connect in a first switching position the lower plate in the respective capacitor to a conductor 11, to which a reference voltage $V_R$ is applied and in a second switching position to connect the same plate with a conductor 12, to which an earth terminal is connected. The upper plates of the capacitors are connected to a conductor 13 which can be connected to an earth terminal with the aid of a controllable switch 14. The conductor 13 is also connected to a comparator 15 and a capacitor 16, this capacitor usually being called the "sampling capacitor" in a converter of this kind. This capacitor can in turn be connected to the analogue input voltage $V_{IN}$ or to earth terminal via a controllable switch 17. A means 18 for sampling and approximating logic can selectively control all the switches, inter alia depending on the output signal from the comparator 15. The comparator is arranged to compare the potential in the conductor 13 with a zero potential.

During a sampling phase the conductor 13 is earthed via the switch 14. The switches 6–10 are put in the switching position representing a digital initial value. For unipolar input signals, this suitably corresponds to the lower plates of all the capacitors 1–5 being connected to earth. The analogue input signal $V_{IN}$ is connected to the sampling capacitor 16 via the switch 17. After the sampling phase, the earthing is first interrupted via the switch 14 and thereafter the switching position of the switch 17 is shifted from $V_{IN}$ to earth.

During a subsequent approximating phase the switch positions of the switches 6–9 are shifted selectively according to some suitable algorithm, and in response to the comparison results of the comparator such as to minimize the potential on the conductor 13 by charge redistribution. The switching positions are illustrated in the figure at the beginning of the approximating phase. Said potential will be equal to $-V_{IN}+V_R(b_4/2+b_3/4+b_2/8+b_1/16)$ where $b_4-b_1$ represent the binary bits in the digital word corresponding to the analogue input signal at the finish of the approximating phase. The bit $b_4$ is the most significant bit, and corresponds to the control signal of the means 18 to the switch 6 at the largest capacitor 1, bit $b_3$ the next most significant bit corresponding to the control signal to the switch 7 at the next largest capacitor 2 and so on. A control signal in the form of a logical one signifies that the capacitor in question is connected to the reference voltage $V_R$, and a logical zero that the capacitor is connected to earth. In so-called successive approximation with binary searching the bits are determined one at a time with guidance from the comparison results from the comparator 15, the most significant bit being determined first, the next most significant second and so on. The switching position of the switch 10 at the terminating capacitor 5 is not shifted during the approximating phase, but is constantly connected to earth during the phase. The control signal denoted by $b_0$ associated with this switch is thus not included in the digital output signal of the converter. The task of the terminating capacitor is to make the increment in the quantifying levels into $V_R/2^N$ instead of $V_R/(2^N-1)$ where N is the number of bits in the digital output signal of the converter.

For bipolar signals the greatest capacitor 1, i.e. half the total capacitance of the capacitors 1-5, is connected during the sampling phase to $V_R$ by the switch 6 instead of to earth. In this case however, the converter is adapted such that the capacitor 1 is connected to earth, during the approximating phase, when $b_4$ is a logical one and to $V_R$ when $b_4$ is a logical zero. The switches 2-4 are shifted in the same way as with the unipolar case. During the approximating phase the potential in the conductor 13 will be $-V_{IN}/2+V_R(-b_4/2+b_3/4+b_2/8+b_1/16)$. At the end of the approximating phase the bit pattern $b_4-b_1$ thus constitutes the counterpart of the analogue input voltage in two-complement form.

A converter according to the above is also described in "IEEE Journal of Solid-State Circuits", Vol. SC-10, No. 6, December 1975, pp. 371-385, but with the difference that the input signal is connected to the lower instead of the upper plates of the capacitors, and that the sampling capacitor is therefore lacking.

Figure 2:
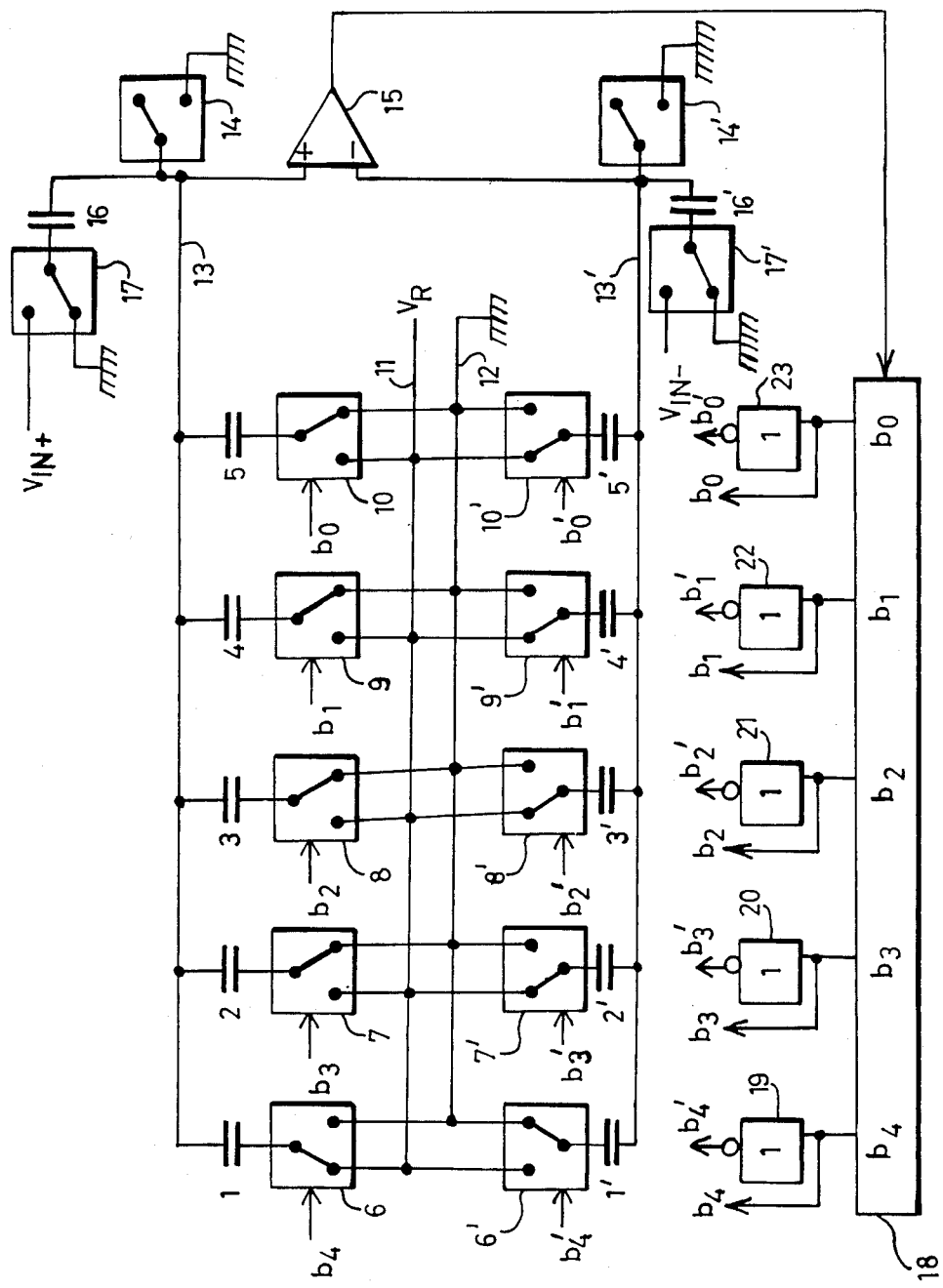
FIGS. 2-4 illustrate first, second and third embodiments of an apparatus in accordance with the invention.

As mentioned above, a balanced signal may be analogue-digital converted with the aid of two separate A/D converters and a digital difference former. In accordance with the present invention, such conversion can be achieved instead with an apparatus which is less voluminous than one comprising two completely separate converters and a difference former. In FIG. 2 there is shown a first embodiment of an apparatus in accordance with the invention. Means having correspondance in FIG. 1 have been denoted in the same way as in FIG. 1. The apparatus includes two alike, but complementally controlled capacitor sets 1-5 and 1'-5' with associated switches 6-10 and 6'-10', a single comparator 15 and a single means for sampling and approximating logic 18. The balanced input signal on the two signal conductors is denoted $V_{IN+}$ and $V_{IN-}$ and is supplied to the respective associated sampling capacitor 16 and 16' via switches 17 and 17'.

In the apparatus according to this embodiment, the switches 6-10 associated with the one set are controlled simultaneously as well as complementally with the switches 6'-10' associated to the other set, so that the capacitors in one set are always complementally connected to the reference voltage $V_R$ and earth, as compared with the corresponding capacitors in the other set. During the sampling phase, the largest capacitor 1, 1' in each set is suitably complementally set in relation to the remaining capacitors in the same set. For example, the capacitor 1 will be connected to the reference voltage $V_R$, the capacitors 2-5 to earth, the capacitor 1' to earth and the capacitors 2'-5' to $V_R$. As with the known bipolar case according to the above, if two's-complement representation is desired, the switch 6 or 6' for the largest capacitor in each set is actuated complementally for a given control signal in relation to the switches for the remaining capacitors in the same set. By the latter is intended that a given binary value, e.g. of the bit $b_4$, will result in that the capacitor 1 is connected to the conductor 11, whereas the same binary value of e.g. the bit $b_3$ would result in that the capacitor 2 is connected to the conductor 12 and vice versa. The switches for the capacitors 1'-5' in the second set are actuated in the same way as the corresponding switch for the capacitors 1-5 but obtain complemental control signals compared therewith. Analogous with the known bipolar case, the switch positions of the switches 10,10' for the terminating capacitors 5,5' will not be changed during the approximation phase.

The signals $b_4-b_0$ control the switches 6-10, and the signals $b_4'-b_0'$, which are obtained at the outputs from a group of inverters 19-23, control the switches 6'-10'. As with the known converter according to the above, the control signal $b_0$ is not changed during the conversion. The switches 10 and 10' will therefore be supplied constant control signals $b_0$ and $b_0'$. In the Figure the positions of the switches are shown during the approximating phase in the use of a control word in the middle of the digital number range. In two's complement representation this word is 00000. Similar to the known converter according to FIG. 1, the difference in voltage between sampling and approximating phases will be corresponded to by the difference in digital control word during sampling and at the end of the approximating phase. Since a balanced input signal is used, it is the difference voltage $V_{IN+}-V_{IN-}$ which is converted.

By the switches in one set being controlled simultaneously and complementally in relation to the switches in the second set, each switching will result in charge redistributions within the capacitor groups so that the potentials at both inputs of the comparator are changed just as much but with different signs. The differential input voltage $V_{IN+}-V_{IN-}$ supplied to the apparatus will give rise to the potentials: $-V_{IN+}/2+V_R(-b_4/2+b_3/4+b_2/8+b_1/16)$ and $-V_{IN-}/2+V_R(-b_4'/2+b_3'/4+b_2'/8+b_1'/16)$ at the inputs of comparator 15.

The potential difference across the comparator inputs is thus twice as large as in the converter according to FIG. 1, which reduces the requirement for amplifying the comparator voltage. For a perfectly balanced input signal, i.e. for voltages which are equally as great as to their magnitude, e.g. $+7$ V and $-7$ V, on the incoming signal conductors, both those potentials will be equal to, or at least practically equal to, zero volts. For poor balancing, e.g. $+8$ V and $-6$ V, the potentials at the inputs of the comparator will instead be half (0.5 V) of the voltage with which the voltages on the signal conductors deviate from their perfectly balanced values (+7 V, −7 V). In this case as well, the switches will stop in the positions (corresponding to +7 and −7) which would have resulted from a perfectly balanced input signal, since the output voltage of the comparator is only responsive to the potential difference across its input.

With the illustrated converter comprising two simultaneously and complementally controlled capacitor sets only a single comparator and a single means for sampling and approximating logic is required.

It should be pointed out that an arbitrary digital reference value can be utilized in both this as well as in the following embodiments. It is thus not necessary that only one or that all except one of the capacitors in each set is or are connected to the reference voltage $V_R$ during the sampling phase. It should also be pointed out that the number of capacitors and associated switches in a practical embodiment is greater than what has been shown and described in connection with this and the following embodiments.

Figure 3:
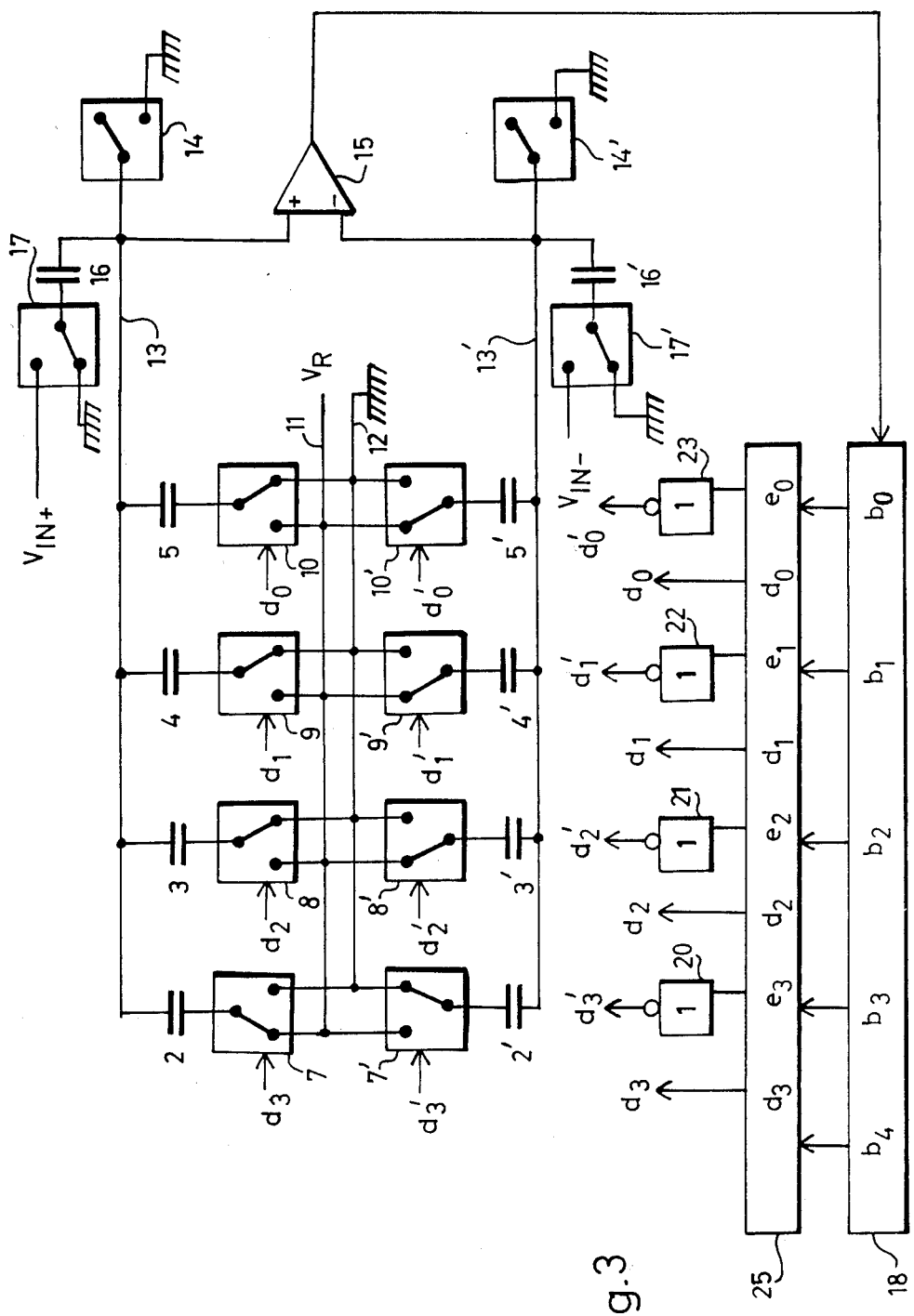

A second embodiment of an apparatus in accordance with the invention is illustrated in FIG. 3, means with correspondence in FIGS. 1 and 2 being denoted in the same way as in those figures. In this embodiment, both the largest capacitors 1 and 1' are dispensed with, which results in a large saving in space. Since the capacitances of the capacitors are mutually, binarily weighted, the surface taken up by the capacitors is reduced to half, compared with the apparatus according to FIG. 2. The number of binary bits in the digital output signal is unchanged, however, which is explained below. It may be mentioned that in practice the capacitors suitably are made up from capacitors which are of the same size but varying as to number, so-called unit capacitors on integrated circuits. The number of capacitors is also reduced to half in such a case.

In this embodiment the capacitors 2 and 2' are thus the ones with the greatest capacitance in the respective set. The switches 7 and 7' for these capacitors are intended to be actuated in the same way as for the capacitors 1 and 1' in the embodiment according to FIG. 2. The reduced number capacitors is enabled by the switching positions of one or more of the switches 7–9 in the one capacitor set 2–4 not always being changed simultaneously as the switching positions of the corresponding switches 7'–9' in the other set of capacitors 2'–4'. The switching positions of the switches in the one set will thereby not always be complemental in relation to the switching positions of the switches in the other set. This is applicable both during the sampling phase as during the approximating phase.

A logic means is denoted by the numeral 25 and is used for generating control words to the switches 7–10 and 7'–10' in response to the digital words from the means 18 for sampling and approximating logic. The means 25 may for example be made up of a digital adder or a read memory. If, as before, the digital bit $b_0$ is ignored, since it is not changed and is not included in the digital output signal, different four-bit words $b_4,b_3,b_2,b_1$ are sent from the means 18 according to this embodiment. For each of these words the logic means 25 generates two three-bit words $d_3,d_2,d_1$ and $e_3,e_2,e_1$. The bits $d_3-d_1$ are utilized as control signals for the switches 7–9, while the bits $e_3-e_1$ are supplied to the inverters 20–22, which generate control signals $d_3'-d_1'$ for the switches 7'–9'. The constant digital bit $b_0$ gives rise to the control signals $d_0$ and $d_0'$, which are utilized as control signals for the switches 10 and 10'.

If a growing binary sequence is sent from the means 18 for sampling and approximating logic, the switching position of one or more switches pertaining to one set shall only be changed for uneven numbers in said binary sequence, whereas the switching position in one or more switches pertaining to the other set is only changed for even numbers. In this case the control words supplied to the switches pertaining to both sets constitute each others complement for half of the possible digital words which can be generated by the means 18 for sampling and approximating logic. In this way, just as many different voltage levels can be put across the inputs of the comparator 15 as with the apparatus according to FIG. 2, although the latter has one capacitor more (the greatest one) in each group. In practice, the approximating phase will naturally be of shorter duration if, for example, successive approximation with binary searching according to the above is applied, than if the means 18 sends a successively growing binary sequence. An example of generated control words from the logic means 25 for different digital words from the means 18 is shown in the following table.

| $b_4$ | $b_3$ | $b_2$ | $b_1$ | $d_3$ | $d_2$ | $d_1$ | $e_3$ | $e_2$ | $e_1$ | $d_3'$ | $d_2'$ | $d_1'$ |
|---|---|---|---|---|---|---|---|---|---|---|---|---|
| 0 | 0 | 0 | 0 | 0 | 0 | 0 | 0 | 0 | 0 | 1 | 1 | 1 |
| 0 | 0 | 0 | 1 | 0 | 0 | 0 | 0 | 0 | 1 | 1 | 1 | 0 |
| 0 | 0 | 1 | 0 | 0 | 0 | 1 | 0 | 0 | 1 | 1 | 1 | 0 |
| 0 | 0 | 1 | 1 | 0 | 0 | 1 | 0 | 1 | 0 | 1 | 0 | 1 |
| 0 | 1 | 0 | 0 | 0 | 1 | 0 | 0 | 1 | 0 | 1 | 0 | 1 |
| 0 | 1 | 0 | 1 | 0 | 1 | 0 | 0 | 1 | 1 | 1 | 0 | 0 |
| 0 | 1 | 1 | 0 | 0 | 1 | 1 | 0 | 1 | 1 | 1 | 0 | 0 |
| 0 | 1 | 1 | 1 | 0 | 1 | 1 | 1 | 0 | 0 | 0 | 1 | 1 |
| 1 | 0 | 0 | 0 | 1 | 0 | 0 | 1 | 0 | 0 | 0 | 1 | 1 |
| 1 | 0 | 0 | 1 | 1 | 0 | 0 | 1 | 0 | 1 | 0 | 1 | 0 |
| 1 | 0 | 1 | 0 | 1 | 0 | 1 | 1 | 0 | 1 | 0 | 1 | 0 |
| 1 | 0 | 1 | 1 | 1 | 0 | 1 | 1 | 1 | 0 | 0 | 0 | 1 |
| 1 | 1 | 0 | 0 | 1 | 1 | 0 | 1 | 1 | 0 | 0 | 0 | 1 |
| 1 | 1 | 0 | 1 | 1 | 1 | 0 | 1 | 1 | 1 | 0 | 0 | 0 |
| 1 | 1 | 1 | 0 | 1 | 1 | 1 | 1 | 1 | 1 | 0 | 0 | 0 |
| 1 | 1 | 1 | 1 | 1 | 1 | 1 | 0 | 0 | 0 | 1 | 1 | 1 |

It is essential that the binary words $d_3,d_2,d_1$ and $e_3,e_2,e_1$ are mutually alike for alternate binary words $b_4,b_3,b_2,b_1$ from the means 18, and that for the remaining binary words from the means 18 they only deviate by the binary value 1 from each other. It is of course conceivable that the means 25 directly generates the values $d_3',d_2',d_1'$ instead of $e_3,e_2,e_1$, whereby the inverters 20–23 can be eliminated.

As with the converter according to FIG. 2, the Figure illustrates the positions of the switches during the approximating phase and corresponding to the control word 00000 from the means 18.

For a perfectly balanced input signal, there is not always obtained a perfect balance across the inputs of the comparator, in contradistinction to the apparatus according to FIG. 2. The deviation from perfect balance corresponds at most to the voltage contribution from one of the smallest capacitors 4 and 4'. The potentials from the comparator inputs will be $-V_{IN+}/2+V_R(-d_3/2+d_2/4+d_1/8)$ and $-V_{IN-}/2+V_R(-d_3'/2+d_2'/4+d_1'/8)$.

It can be mentioned that the terminating capacitors 5,5' as is the case with the known converter, are not necessary in the embodiments according to FIGS. 2 and 3.

Further to the space saving achieved with the converter according to FIG. 2, there has also been achieved in this case that half the capacitor area has been eliminated. However, the logic means 25 has been added.

Figure 4:
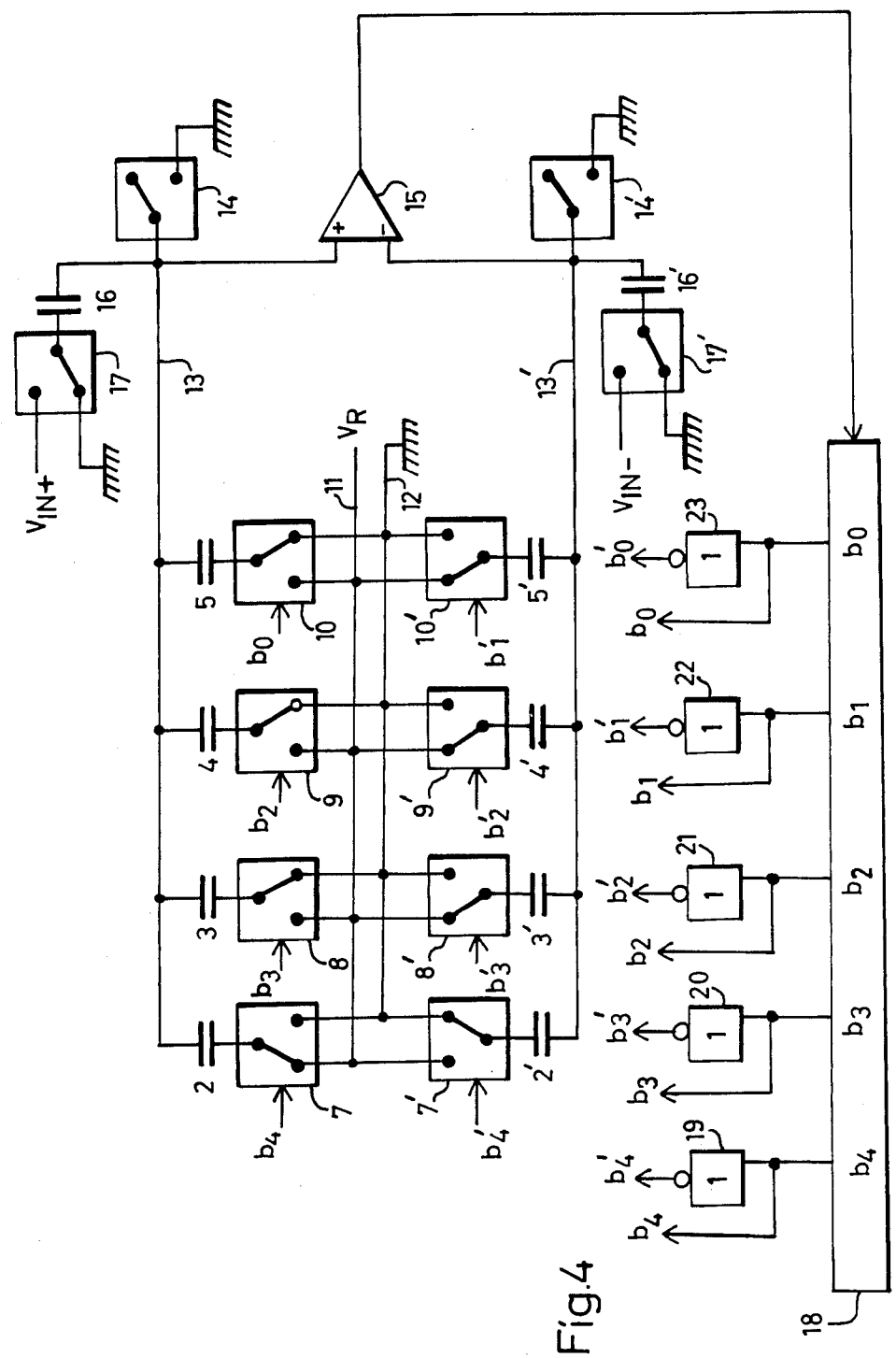

A third embodiment for an apparatus in accordance with the invention is illustrated in FIG. 4, means with correspondence in previous figures having been given the same denotations as in those figures. Similar to the apparatus according to FIG. 3, both the largest capacitors 1,1' are excluded. In contrast to that apparatus, however, the logical means 25 is also excluded.

According to this embodiment the switch, e.g. 10', is supplied with a varying control signal at one of the two terminating capacitors 5 and 5' so that this capacitor is also utilised for charge redistribution. This signal originates in accordance with the example from the least significant bit $b_1$, in the varying four-bit word generated by the means 18 and supplied to the switch directly, or via the inverter 22, in response to whether the capacitor in question is situated in the upper or lower capacitor set as seen in the Figure. The switch (10 according to the example) for the upper of the two terminating capacitors is supplied a constant control signal, e.g. $b_0$, in this case as well. The signals $b_4$ and $b_4'$ are supplied, analogous with the converter in FIG. 2, to the switches 7 and 7' for both the largest capacitors, in this case 2 and 2'. The switches 8 and 8' are supplied with $b_3$ and $b_3'$, the switches 9 and 9' with $b_2$ and $b_2'$. The signal $b_1$ is only utilised in its inverted form $b_1'$, which is supplied to the switch 10' for the capacitor 5' in the lower capacitor set. The control signal $b_0$, which is constant during the approximating phase, is supplied to the switch 10 for the capacitor 5 in the upper set.

The means 25 in FIG. 3 may be realized as a digital adder or a read memory, which in both cases signifies a complex logical function. In the apparatus according to FIG. 4 an addition is carried out in a simple way in the analogue domain instead, in the form of a charge packet equal to $V_R \times C/8$, which corresponds to the least significant bit in the digital output signal of the apparatus. The potentials at the inputs of the comparator 15 will be
$-V_{IN+}/2 + V_R(-b_4/2 + b_3/4 + b_2/8)$ and
$-V_{IN-}/2 + V_R(-b_4'/2 + b_3'/4 + b_2'/8 + b_1'/8)$.

In this case there are thus merely required a single comparator and a single means for sampling and approximating logic, simultaneously as both half the capacitor surface in the converter according to FIG. 2 and the logical means 25 in the converter according to FIG. 3 have been eliminated.

The invention can of course be varied within the scope of the claims. For example, said control signals and control words may be generated differently than has been described, if the switches and/or their connections to certain points are adjusted at the same time so that the function will be unchanged in principle. Accordingly, the inverters can be eliminated if the switches associated to one set are given an opposite inherent function to the one described. Neither is it necessary for the capacitances of the capacitors to be binarily weighted. What is essential is that for an N-bit converter there are $2^N$ different ways of redistributing electric charge. For example, a plurality of equally as large capacitors can be utilised in each set, one controllable switch being associated to such capacitor. All earth terminals can also be replaced by points connected to other suitable fixed potentials so that, for example, the capacitors may be selectively connected to a first or a second arbitrary reference voltage. A capacitor in series with the respective conductor 13, 13' may be connected in series in a manner known per se in each capacitor set between two of the normal capacitors. The task of this capacitor is to decrease by a suitable factor the effective capacitance of the capacitors on its one side. It is of course also conceivable to arrange such that the analogue input voltage is connected to the capacitors via the switches 6–10 and 6'–10' analogously with what has been shown in the article mentioned above.

What is claimed is:

1. An apparatus for converting an analog, balanced signal consisting of a differential signal pair to a digital signal by charge redistribution, comprising:

a plurality of capacitive elements grouped equally in two sets, each capacitive element in a first set corresponding to a capacitive element of just as great a capacity in a second set;

a corresponding plurality of switches connected in series with respective ones of said capacitive elements through which switches a first terminal of each capacitive element is selectively connected, at least during an approximation phase, to one of a first and second reference voltage the capacitive elements and associated switches in the first set being arranged to store a charge related to a potential at a first point and the corresponding capacitive elements and switches in the second set being arranged to store a charge related to a potential at a second point;

analog sampling means causing a differential signal pair, at least during a sampling phase, to control the potential at said first and second points, respectively;

a comparator comparing the potentials at said first and second points; and sampling and approximating logic means generating a digital word which is changed during the approximating phase in response to the comparison of the comparator, said digital word controlling said plurality of switches such that switching positions of the switches associated with the capacitive elements in the first set are only changed for half of a number of possible digital words and the switching positions of the switches associated with the corresponding capacitive elements in the second set are only changed for the other half of the number of possible digital words, and such that the switching positions of the switches associated with the capacitive elements in the first set are complemental to the switching positions of the switches associated with the corresponding capacitive elements in the second set for one of said halves of the number of possible digital words, said digital word at the end of the approximating phase constituting a digital output signal of the apparatus.

2. Apparatus as claimed in 1, wherein each of said sets contains at least two capacitive elements (4 and 5, 4' and 5') the capacitances of which are equally as great and do not exceed the capacitance of any one of the remaining capacitive elements in both sets.

3. Apparatus as claimed in claim 2, wherein the switching position of the switch (10, 10') associated with a predetermined one (5, 5') of said at least two capacitive elements, which have just as great capacitance in each set, is kept unchanged during the approximating phase.

4. An apparatus for converting an analog, balanced signal consisting of a differential signal pair to a digital signal by charge redistribution, comprising:
- a plurality of capacitive elements grouped equally in two sets, each capacitive element in a first set corresponding to a capacitive element of just as great a capacity in a second set, each set containing at least two capacitive elements the capacitances of which are equal and do not exceed the capacitance of any one of the remaining capacitive elements in both sets;
- a corresponding plurality of switches connected in series with respective ones of said capacitive elements through which switches a first terminal of each capacitive element is selectively connected, at least during an approximation phase, to one of a first and second reference voltage, the capacitive elements and associated switches in the first set being arranged to store a charge related to a potential at a first point and the corresponding capacitive elements and switches in the second set being arranged to store a charge related to a potential at a second point;
- analog sampling means causing said differential signal pair, at least during a sampling phase, to control the potential at a first and second points, respectively;
- a comparator comparing the potentials at said first and second points; and
- sampling and approximating logic means generating a digital word which is changed during the approximating phase in response to the comparison of the comparator, said digital word controlling said plurality of switches such that the switching position of the switch associated with one of said at least two capacitive elements in the first set is kept unchanged, while a switching position of the switch associated with the corresponding capacitive element in the second set is changed in response to a least significant bit in the digital word generated by said sampling and approximating logic means.

5. The apparatus of claim 4 in which the remaining switches are controlled such that a change in the switching positions of the switches associated with the capacitive elements in the first set takes place simultaneously with and complementarily to a change in the switching positions of the switches associated with the corresponding capacitive elements in the second set.

* * * * *